(12) United States Patent
Sadaka et al.

(10) Patent No.: US 8,890,299 B2
(45) Date of Patent: Nov. 18, 2014

(54) BONDED SEMICONDUCTOR STRUCTURES AND METHODS OF FORMING SAME

(75) Inventors: Mariam Sadaka, Austin, TX (US); Radu Ionut, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/575,200

(22) PCT Filed: Jan. 26, 2011

(86) PCT No.: PCT/US2011/022622
§ 371 (c)(1),
(2), (4) Date: Aug. 21, 2012

(87) PCT Pub. No.: WO2011/097102
PCT Pub. Date: Aug. 11, 2011

(65) Prior Publication Data
US 2012/0313237 A1 Dec. 13, 2012

Related U.S. Application Data

(60) Provisional application No. 61/301,482, filed on Feb. 4, 2010.

(51) Int. Cl.
*H01L 23/02* (2006.01)
*H01L 25/00* (2006.01)
*H01L 21/3105* (2006.01)
*H01L 23/00* (2006.01)

(52) U.S. Cl.
CPC ............. *H01L 24/02* (2013.01); *H01L 2924/14* (2013.01); *H01L 2924/01051* (2013.01); *H01L 2924/04941* (2013.01); *H01L 2924/01023* (2013.01); *H01L 2224/81894* (2013.01); *H01L 2924/05042* (2013.01); *H01L 2924/0103* (2013.01); *H01L 2924/01013* (2013.01); *H01L 2924/01044* (2013.01); *H01L 25/50* (2013.01); *H01L 2924/01015* (2013.01); *H01L 2924/01027* (2013.01); *H01L 21/31053* (2013.01); *H01L 21/3105* (2013.01); *H01L 2924/01074* (2013.01); *H01L 2924/04953* (2013.01); *H01L 2924/01032* (2013.01); *H01L 2924/01006* (2013.01); *H01L 2924/01029* (2013.01); *H01L 2924/014* (2013.01); *H01L 2224/83894* (2013.01); *H01L 2924/01073* (2013.01); *H01L 2924/01082* (2013.01); *H01L 2924/01033* (2013.01); *H01L 2924/01005* (2013.01); *H01L 2924/01028* (2013.01); *H01L 2924/01022* (2013.01); *H01L 24/80* (2013.01); *H01L 2924/01014* (2013.01); *H01L 2924/01049* (2013.01)
USPC ........................................................ 257/686

(58) Field of Classification Search
USPC ............. 257/E21.23, E21.614, E23.085, 686; 438/109, 118, 406, 455, 692
See application file for complete search history.

(56) References Cited

U.S. PATENT DOCUMENTS 5,286,997 A * 2/1994 Hill ................................ 257/586
5,298,438 A * 3/1994 Hill ................................ 438/353
(Continued)

FOREIGN PATENT DOCUMENTS

WO 2007060145 A1 5/2007

OTHER PUBLICATIONS

Christiansen et al., Wafer Direct Bonding: From Advanced Substrate Engineering to Future Applications in Micro/Nanoelectronics, Proceedings of the IEEE, vol. 94, No. 12, pp. 2060-2106 (2006).

(Continued)

*Primary Examiner* — Asok K Sarkar
(74) *Attorney, Agent, or Firm* — TraskBritt

(57) ABSTRACT

Embodiments of the invention include methods and structures for fabricating a semiconductor structure and, particularly, for improving the planarity of a bonded semiconductor structure comprising a processed semiconductor structure and a semiconductor structure.

19 Claims, 3 Drawing Sheets

(56) References Cited

U.S. PATENT DOCUMENTS

2006/0292744 A1   12/2006   Enquist et al.
2008/0006938 A1   1/2008    Patti et al.
2009/0263953 A1*  10/2009   Tong et al. .................. 438/455

OTHER PUBLICATIONS

International Search Report for International Application No. PCT/US2011/022622 dated Apr. 21, 2011, 4 pages.
Joshi et al., A new Damascene structure for submicrometer wiring, IEEE Electron Device Letters, vol. 14, No. 3, pp. 129 132 (1993).
Tong et al., Semiconductor wafer bonding: recent developments, Materials, Chemistry and Physics, vol. 37, pp. 101-127 (1994).
International Preliminary Report on Patentability and Written Opinion for International Application No. PCT/US2011/022622 dated Aug. 7, 2012, 6 pages.
Korean Preliminary Rejection for Korean Application No. 10-2012-7023056 dated Aug. 29, 2013, 8 pages including translation.

* cited by examiner

BONDED SEMICONDUCTOR STRUCTURES AND METHODS OF FORMING SAME

CROSS-REFERENCE TO RELATED APPLICATIONS

This application is a national phase entry under 35 U.S.C. §371 of International Patent Application PCT/US2011/022622, filed Jan. 26, 2011, published in English as International Patent Publication WO 2011/097102 A1 on Aug. 11, 2011, which claims the benefit under Article 8 of the Patent Cooperation Treaty to U.S. Provisional Patent Application Ser. No. 61/301,482, filed Feb. 4, 2010, for "BONDED SEMICONDUCTOR STRUCTURES AND METHODS OF FORMING SAME," the disclosure of each of which is hereby incorporated herein by this reference in its entirety.

TECHNICAL FIELD

The various embodiments of the present invention generally relate to methods and structures for forming semiconductor structures and to the resulting structures formed using such methods and structures, and more particularly to methods and structures for forming smooth planar semiconductor structures for attachment of additional semiconductor structures thereto.

BACKGROUND

The three dimensional (3D) integration of two or more semiconductor structures may be beneficial in microelectronic applications. For example, 3D integration of microelectronic devices may result in improved electrical performance and power consumption whilst reducing the overall device footprint. See, for example, the publication of P. Garrou et al., 2008, entitled "The Handbook of 3D Integration," Wiley-VCH.

The 3D integration of semiconductor structures may be achieved by a number of methods, including for example, the attachment of one or more semiconductor structures to a processed semiconductor structure that comprises a plurality of device structures. The attachment of a semiconductor structure to a processed semiconductor structure may be achieved by a number of methods. Upon attaching the semiconductor structure to the processed semiconductor structure, the semiconductor structure may undergo additional processes and may itself be used as a receiving substrate for the attachment of further semiconductor structures. It should also be noted that the 3D integration of semiconductor structures may take place by the attachment of a semiconductor die to another semiconductor die (i.e., die-to-die (D2D)), the attachment of a semiconductor die to a semiconductor wafer (i.e., die-to-wafer (D2W)) as well as the attachment of a semiconductor wafer to another semiconductor wafer (i.e., wafer-to-wafer (W2W)), or a combination thereof.

However, the smoothness and the planarity of each of the structures to be attached to one another, e.g., the attachment surfaces of the processed semiconductor structure and the semiconductor structures, may have an effect on the quality of the completed 3D integrated semiconductor structure. For example, when the 3D integration of a structure comprises a processed semiconductor structure in which semiconductor devices have been processed, such processes may result in rough, non-planar surfaces. Subsequent attachment of a semiconductor structure to the rough, non-planar surfaces of the processed semiconductor structure may result in a poor adhesion between the semiconductor structure and the processed semiconductor structure, which may result in an undesirable separation of the semiconductor structure from the processed semiconductor structure during subsequent processes.

By way of introduction FIGS. 1A-1C illustrate a previously known method for formation of a 3D integrated structure.

FIG. 1A illustrates semiconductor structure 100 comprising processed semiconductor structure 102. The processed semiconductor structure may include conducting region 104, dielectric layer 106 and device substrate 108. Conducting region 104 may comprise a number of subregions, such subregions comprising, for example, barrier subregions and electrode subregions. In addition, conducting region 104 may comprise one or more of a number of materials, such as, for example, cobalt, ruthenium, nickel, tantalum, tantalum nitride, indium oxide, tungsten, tungsten nitride, titanium nitride, copper and aluminum.

Dielectric layer 106 may comprise a number of layers and materials, such as, for example, one or more of polyimides, benzocyclobutene (BCB), boron nitrides, boron carbide nitrides, porous silicates, silicon oxides, silicon nitrides and mixtures thereof (e.g., silicon oxynitride).

Device substrate 108 may comprise one or more device structures 110. For example, the one or more device structures 110 may comprise one or more switching structures (e.g., transistors, etc.), light emitting structures (e.g., laser diodes, light emitting diodes, etc.), light receiving structures (e.g., waveguides, splitters, mixers, photodiodes, solar cells, solar subcells, etc.), and/or microelectromechanical system structures (e.g., accelerometers, pressure sensors, etc.). Device substrate 108 may comprise a number of layers and materials, such as, for example, one or more of silicon, germanium, silicon carbide, III-arsenides, III-phosphides, III-nitrides, III-antimonides, sapphire, quartz and zinc oxide. In some embodiments of the invention, device substrate 108 may comprise one or more of a metal-oxide-semiconductor (CMOS) integrated circuit, a transistor-transistor logic integrated circuit and a NMOS logic integrated circuit.

FIG. 1B illustrates semiconductor structure 115 comprising processed semiconductor structure 102. Processed semiconductor structure 102 may include dielectric layer 106, device substrate 108 and conducting regions 112, which may be defined upon removal of a portion of conducting region 104 (shown in phantom). A portion of conducting region 104 may be removed to produce a plurality of conducting regions 112, wherein the plurality of conducting regions 112 may provide electrical connections between device structures 110 present within device substrate 108. A portion of conducting region 104 may be removed by methods such as, for example, polishing, grinding and in some embodiments of the invention by chemical-mechanical polishing (CMP). Such processes for forming conducting regions 112 may be referred to in the art as "Damascene" methods, and examples of such processes are disclosed in, for example, Joshi et al., "A new Damascene structure for submicrometer wiring," IEEE Electron Device Letters, Volume 14, No. 3, pages 129-132, 1993.

As illustrated in FIG. 1B the removal of a portion of conducting region 104 may result in the removal of portions of the conducting regions 112 below surface 114 (illustrated by the dashed line) and may also result in the removal of portions of dielectric layer 106. The removal of portions of the conducting regions 112 below surface 114 may be referred to in the art as "dishing," and may produce a plurality of dished regions 116. The removal of the dielectric layer 106 below surface 114 may be referred to in the art as "erosion," and may produce a plurality of eroded regions 118. Both the removal of portions of conducting regions 112 and portions of dielectric layer 106 below surface 114 may render a surface 120 non-planar and cause the non-planar surface 120 to have an undesirable surface roughness.

FIG. 1C illustrates semiconductor structure 125, which comprises processed semiconductor structure 102 and semiconductor structure 122. Semiconductor structure 122 may be attached via bonding to processed semiconductor structure 102 at a bonding interface 124 therebetween. As a result of rough non-planar surface 120 of the processed semiconductor structure 102, the bonding interface 124 may be discontinuous, i.e., the bonding interface may comprise bonded and unbonded regions. In addition, the plurality of dished regions 116 and the plurality of eroded regions 118 resulting from processes for removing portions of conducting region 104 may result in a plurality of unbonded regions. Due to a possible high density of unbonded areas between semiconductor structure 122 and processed semiconductor structure 102, the bond strength achieved between the two structures (i.e., between structures 102 and 122) may be insufficient for additional operations, for example, additional operations such as handling and supplementary processing.

DISCLOSURE OF THE INVENTION

The various embodiments of the present invention generally provide methods and structures for forming semiconductor structures, and more particularly, to methods and structures for forming smooth planar semiconductor structures for attachment to additional semiconductor structures. The methods are now briefly described in terms of embodiments of the invention. This summary is provided to introduce a selection of concepts in a simplified form that are further described in the detailed description of the embodiments of the invention. This summary is not intended to identify key features or essential features of the claimed subject matter, nor is it intended to be used to limit the scope of the claimed subject matter.

Therefore, in some embodiments of the present invention, methods of forming a semiconductor structure include forming a first dielectric film overlying a non-planar surface of a processed semiconductor structure and planarizing a surface of the first dielectric film. A second dielectric layer may be formed overlying the planarized surface of the first dielectric film, and a semiconductor structure may be attached to the second dielectric film.

In additional embodiments of the invention, methods for forming a semiconductor structure may include forming at least one dished region and at least one eroded region in a surface of a processed semiconductor structure. The at least one dished region and the at least one eroded region may be plugged by depositing a first dielectric film over the surface of the processed semiconductor structure and planarizing the first dielectric film by a polishing process. A second dielectric film may be deposited overlying the first dielectric film, and a semiconductor structure may be attached to the second dielectric film.

The various embodiments of the invention may also include structures formed by the methods described herein. In some embodiments of the invention, a semiconductor structure comprises a processed semiconductor structure comprising a non-planar surface, a first dielectric film overlying the non-planar surface and a second dielectric film overlying the first dielectric film. Embodiments of the invention may also include a semiconductor structure attached to the second dielectric film.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of example embodiments of the present invention, which are illustrated in the appended figures in which.

MODE(S) FOR CARRYING OUT THE INVENTION

The illustrations presented herein are not meant to be actual views of any particular structure, material, apparatus, system, or method, but are merely idealized representations that are employed to describe the present invention.

Headings are used herein for clarity only and without any intended limitation. A number of references are cited herein. None of the cited references, regardless of how characterized above, is admitted as prior art relative to the invention of the subject matter claim herein.

As used herein, the term "semiconductor structure" means and includes any structure comprising semiconductor material, including bulk semiconductor materials such as a semiconductor wafer (either alone or in assemblies comprising other materials such as metal and insulators thereon), and semiconductor material layers (either alone or in assemblies comprising other materials such as metals and insulators). In addition, the term "semiconductor structure" also includes any supporting structure including, but not limited to, the semiconductor structures described above. The term "semiconductor structure" may also refer to one or more semiconductor layers or structures which includes active or operable portions of semiconductor devices, as well as semiconductor structures during processing (and may include other layers, such as silicon-on-insulator (SOI), etc., that have been fabricated thereupon).

As used herein, the term "processed semiconductor structure" means and includes a semiconductor structure to which various process treatments have been applied.

As used herein, the term "device structure" means and includes any structure comprising active or passive device components intended to be incorporated into a semiconductor device.

As used herein, the term "bonded structure" means and includes two or more semiconductor structures attached to one another through an attachment process.

As used herein, the term "bond assisting layer" means and includes the utilization of one or more intermediate materials to promote the attachment of one or more semiconductor structures to another semiconductor structure thereby forming a bonded structure.

As used herein, the phrase "activating a dielectric film" means and includes modifying the physical and chemical nature of a surface of a dielectric film to promote attachment of the dielectric film to a semiconductor structure.

Embodiments of the invention comprise methods and structures for forming semiconductor structures suitable for attachment, for example, by improving the smoothness and planarity of the surface of a processed semiconductor structure in order to allow attachment of a semiconductor structure to the processed semiconductor structure. Such methods and structures may be utilized for various purposes, such as, for example, for producing 3D integration processes and 3D integrated structures.

Figure 2A:
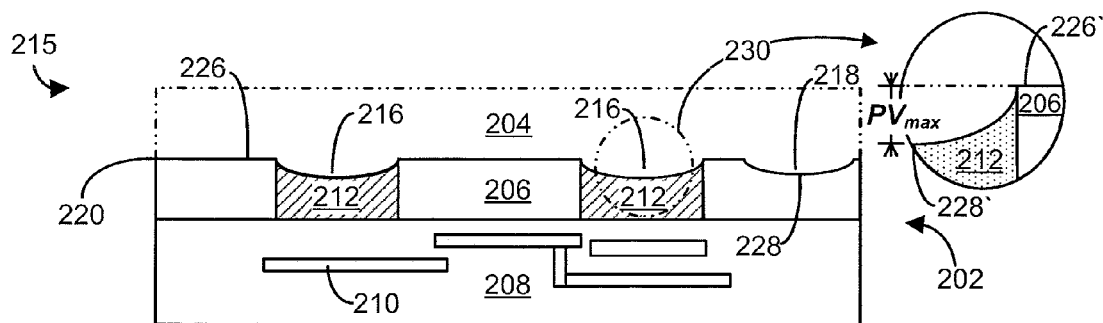
FIGS. 2A-2G schematically illustrate example embodiments of the invention for forming planar smooth semiconductor structures and the attachment of such structures to additional semiconductor structures.

Example embodiments of the invention are described below with reference to FIGS. 2A-2G. FIG. 2A illustrates semiconductor structure 215, which comprises processed semiconductor structure 202. Processed semiconductor structure 202 may comprise device substrate 208, dielectric layer 206 and a plurality of conducting regions 212. Device substrate 208 may comprise homogenous or heterogeneous semiconductor structures comprising a number of layers and materials. In some embodiments of the invention, the device substrate 208 may comprise one or more of silicon, germanium, silicon carbide, III-arsenides, III-phosphides, III-nitrides, III-antimonides, sapphire, quartz and zinc oxide.

Device substrate 208 may comprise a plurality of device structures 210. Such device structures 210 may comprise, for example, one or more of switching structures (e.g., transistors, etc.), light emitting structures (e.g., laser diodes, light emitting diodes, etc.), light receiving structures (e.g., waveguides, splitters, mixers, photodiodes, solar cells, solar subcells, etc.), and microelectromechanical system structures (e.g., accelerometers, pressure sensors, etc.). In some embodiments of the invention, device substrate 208 may comprise one or more of a metal-oxide-semiconductor (CMOS) integrated circuit, a transistor-transistor logic integrated circuit and a NMOS logic integrated circuit.

Conducting regions 212 may comprise a number of subregions. Such subregions may comprise, for example, barrier subregions and/or electrode subregions. In addition, conducting regions 212 may comprise one or more of cobalt, ruthenium, nickel, tantalum, tantalum nitride, indium oxide, tungsten, tungsten nitride, titanium nitride, copper and aluminum. Dielectric layer 206 may comprise a number of layers and materials. Such materials may comprise, for example, one or more of polyimides, benzocyclobutene (BCB), boron nitrides, boron carbide nitrides, porous silicates, silicon oxides, silicon nitrides and mixtures thereof.

Figure 1A:
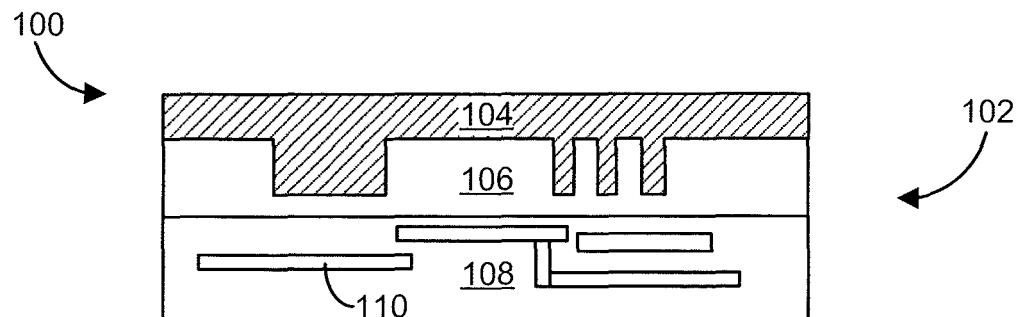
FIGS. 1A-1C schematically illustrate examples of the prior art relating to embodiments of the invention.
Figure 1B:
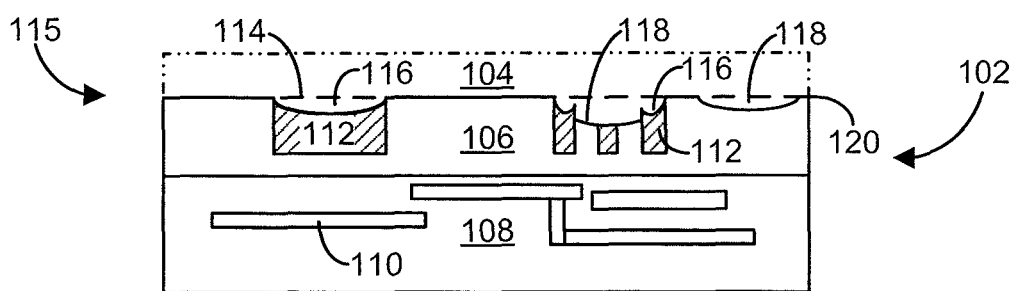
Figure 1C:
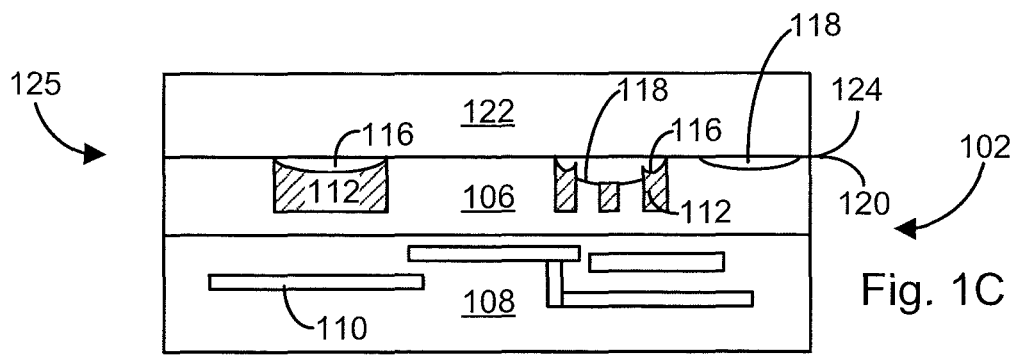

The removal of a portion of conducting region 204, as shown by the phantom region and described in detail above with reference to FIGS. 1A and 1B, may result in the formation of a plurality of dished regions 216. In addition, the removal of a portion of conducting region 204 may result in the formation of a plurality of eroded regions 218 in dielectric layer 206. The formation of a plurality of dished regions 216 and a plurality of eroded regions 218 may result in the formation of non-planar surface 220.

The topology of non-planar surface 220 comprises a plurality of peak regions 226 and a plurality of valley regions 228, wherein the plurality of dished regions 216 and the plurality of eroded regions 218 comprise valley regions 228 (i.e., low lying regions of non-planar surface 220), whereas the regions of the non-planar surface 220 that do not comprise dished regions 216 or eroded regions 218 comprise peak regions 226 (peak region 226 is labeled as an example in FIG. 2A). The maximum peak-to-valley distance may be defined as the maximum vertical distance between the lowest lying valley region 228 and the highest lying peak region 226. For example, FIG. 2A illustrates inset 230 which comprises lowest lying valley region 228' and highest lying peak region 226' of non-planar surface 220. The maximum peak to valley distance $PV_{max}$ of the non-planar surface 220 may be defined as the vertical distance between regions 228' and 226'.

Figure 2B:
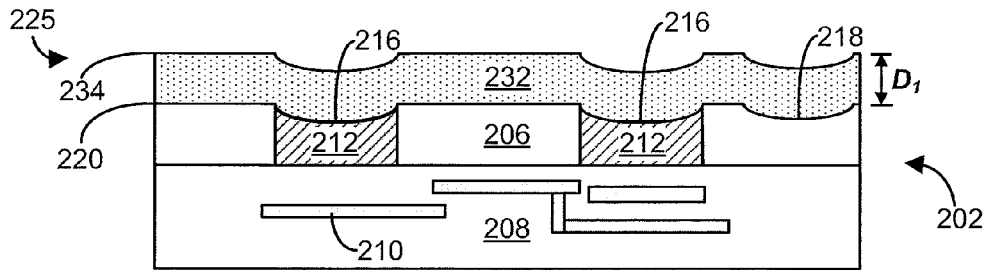

FIG. 2B illustrates semiconductor structure 225, which comprises processed semiconductor structure 202 and a first dielectric film 232. First dielectric film 232 overlays non-planar surface 220 of processed semiconductor structure 202 and has an average thickness $D_1$ and a surface roughness $R_1$. First dielectric film 232 may comprise one or more layers of dielectric materials and may comprise materials such as, for example, silicon oxide, silicon nitride and mixtures thereof (e.g., silicon oxynitride).

First dielectric film 232 may be formed to overlay all or a portion of non-planar surface 220 utilizing any of a number of methods. For example, first dielectric film 232 may be formed utilizing a deposition method, such as, for example, chemical vapor deposition (CVD). A number of CVD methods are known in the art for producing first dielectric film 232. Such CVD methods may include atmospheric pressure CVD (APCVD), low pressure CVD (LPCVD) and ultra-high vacuum CVD (UHCVD). In some embodiments of the invention, first dielectric film 232 may be formed utilizing low temperature CVD methods. Such methods may include, for example, plasma assisted CVD methods, such as, for example, sub-atmospheric CVD (SACVD), microwave plasma-assisted CVD (MPCVD), plasma-enhanced CVD (PECVD) and remote plasma-enhanced CVD (RPECVD). Plasma assisted CVD methods for deposition of first dielectric film 232 may be utilized in some embodiments of the invention to provide a low temperature deposition process. A low temperature deposition process may be utilized in order to prevent degradation of the plurality of device structures 210 present in device substrate 208.

Device substrate 208 may comprise a plurality of device structures 210 that may be damaged if the deposition temperature of first dielectric film 232 is above a critical temperature for the on-set of device degradation. Therefore, in some embodiments of the invention, first dielectric film 232 is formed at a temperature less than about 400° C. In additional embodiments of the invention, the first dielectric film 232 is formed at a temperature less than about 500° C., whereas in yet further embodiments of the invention, the first dielectric film 232 is formed at a temperature less than about 600° C.

As illustrated in FIG. 2B, first dielectric film 232 may be deposited conformally over non-planar surface 220 of processed semiconductor structure 202. Conformal deposition of first dielectric film 232 may be utilized to plug (i.e., fill) the plurality of dished regions 216 and the plurality of eroded regions 218, i.e., filling of the non-planar regions of non-planar surface 220. However, the use of a conformal deposition process to plug the plurality of non-planar regions of processed semiconductor structure 202 may result in a first dielectric film 232 with non-planar surface 234 on a side of the first dielectric film 232 opposite the processed semiconductor structure 202, since the conformal film may have a thickness $D_1$ that is substantially uniform throughout the first dielectric film 232, i.e., in such a way that the material of the first dielectric film 232 substantially preserves the topography of the underlying non-planar surface 220.

In some embodiments of the invention, first dielectric layer thickness $D_1$ may be greater than the maximum peak-to-valley distance $PV_{max}$. The thickness $D_1$ may be selected to be greater than $PV_{max}$ so that a plurality of the dished regions 216 and a plurality of the eroded regions 218 may be at least substantially plugged with first dielectric film 232.

Figure 2C:
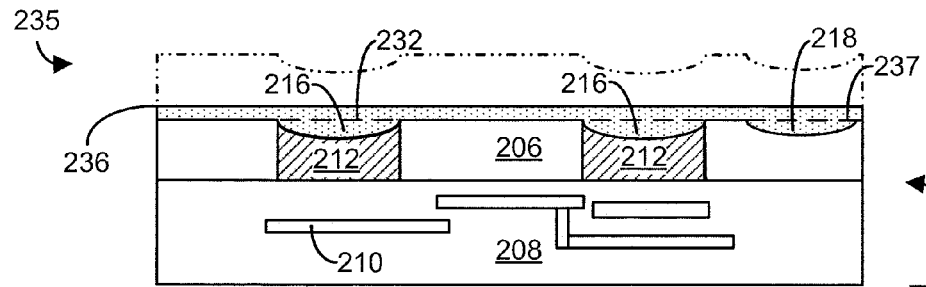

FIG. 2C illustrates semiconductor structure 235, which comprises processed semiconductor structure 202 and first dielectric film 232. First dielectric film 232 may be processed in such a way that the non-planarity of first dielectric film 232, shown in phantom, is substantially removed, resulting in first dielectric film 232 comprising substantially planar surface 236 on a side of the first dielectric film 232 opposite the processed semiconductor structure 202.

A number of methods known in the art may be utilized to planarize the first dielectric film 232. For example, the planarization process may be performed utilizing one or more of an etching process, a grinding process and a polishing process. In some embodiments of the invention, the planarization process may be performed utilizing a chemical-mechanical polishing (CMP) process. The CMP process conditions, in particular the slurry abrasives and chemistry, may be chosen so that the non-planarity of the first dielectric layer 232 is reduced in such a manner as to provide a planar surface 236. In certain embodiments of the invention, a portion of the first dielectric layer 232 may be removed (e.g., by CMP methods) such that remaining portions of dielectric layer 232 are located only in dished regions 216 and eroded regions 218, i.e., below a dashed line 237 in FIG. 2C.

Upon planarization of the first dielectric film 232 to form planar surface 236 of first dielectric film 232, the resulting planar surface 236 may have a root mean square (rms) surface roughness $R_2$, which, in some embodiments of the invention, may be less than about 100 Å, less than about 10 Å, or even less than about 3 Å. The rms surface roughness $R_2$ of planar surface 236 of first dielectric layer 232 may be in excess of (i.e., rougher) that required to successfully attach another semiconductor structure to surface 236. Therefore, further processes may be undertaken to produce a planar surface with a surface roughness suitable for attachment of a semiconductor structure thereto.

Figure 2D:
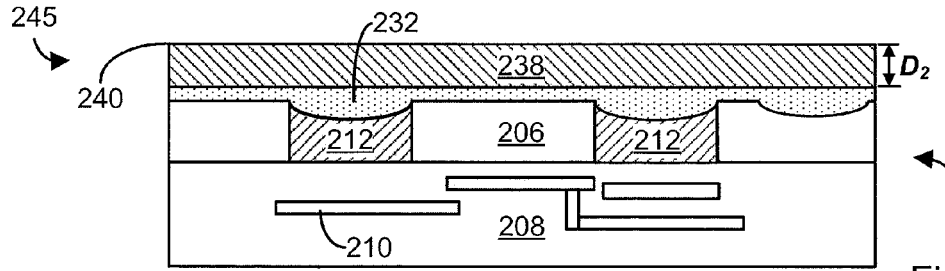

FIG. 2D illustrates semiconductor structure 245, which comprises processed semiconductor structure 202, planarized first dielectric film 232 and second dielectric film 238. Second dielectric film 238 may be formed in such a way that the characteristics, such as, for example, surface roughness and surface chemistry, of surface 240 of second dielectric film 238 may be suitable for attachment of a semiconductor structure directly to the surface 240 of second dielectric film 238.

Second dielectric film 238 may comprise one or more layers of dielectric materials such as, for example, silicon oxides, silicon nitrides and mixtures thereof. Second dielectric film 238 may be deposited utilizing any of a number of methods as described above in relation to first dielectric film 232. In some embodiments of the invention, second dielectric film 238 is forming by CVD methods, and in additional embodiments, may be formed by plasma assisted CVD methods. As previously described above in relation to first dielectric film 232, the formation temperature of the second dielectric film may be limited in order to maintain the integrity of the plurality of device structures 210 found in device substrate 208.

In more detail, device substrate 208 may comprise a plurality of device structures 210 that may be damaged if the deposition temperature of the second dielectric film 238 is above a critical temperature for the on-set of device degradation. Therefore, in some embodiments of the invention, second dielectric film 238 is formed at a temperature less than about 400° C. In additional embodiments of the invention, the second dielectric film 238 is formed at a temperature less than about 500° C., and in yet further embodiments of the invention, the second dielectric film 238 is formed at a temperature less than about 600° C.

Second dielectric film 238 may be formed, for example, by deposition techniques to a selected thickness $D_2$. In some embodiments of the invention, the thickness $D_2$ of second dielectric film 238 may be less than the original thickness $D_1$ of first dielectric film 232 (i.e., the thickness immediately after deposition). Therefore, in some embodiments of the invention, the overall thickness of the dielectric layers utilized for bonding may be less than that of previously known methods, which may result in improved bonding characteristics relative to previously known techniques. Limiting the thickness of the dielectric films may not only improve the uniformity of such films but may also lead to a lower cost of ownership, as well as improved yields, for example, when semiconductor structures comprise through-substrate vias (TSVs).

In addition, second dielectric film 238 may include second dielectric film surface 240, which may have a root mean square (rms) surface roughness $R_3$, which, in some embodiments of the invention, may be sufficient to successfully attach another semiconductor structure to surface 240. In some embodiments of the invention, surface 240 may have an rms roughness $R_3$ less than about 100 Å, less than about 10 Å, or even less than about 3 Å. However, in some embodiments of the invention, surface roughness $R_3$ may exceed that required to successfully attach another semiconductor structure thereto, and additional processes may be undertaken to reduce the rms surface roughness $R_3$ of surface 240.

Figure 2E:
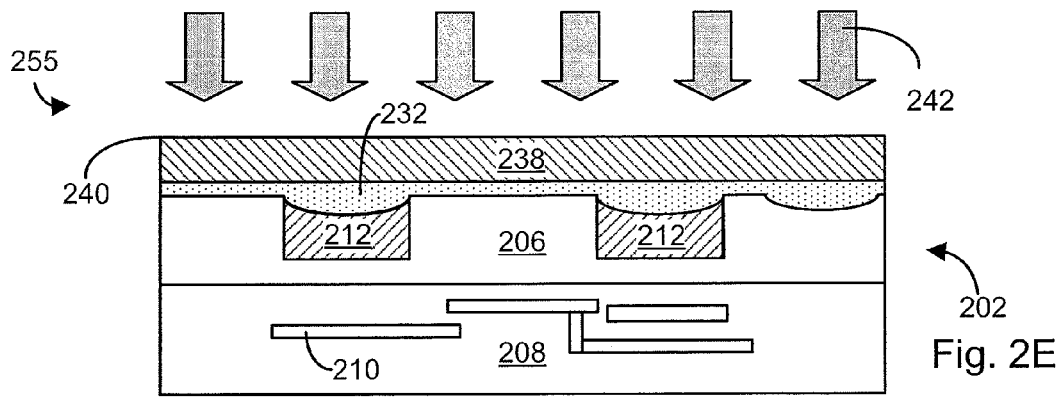

FIG. 2E illustrates semiconductor structure 255, which comprises processed semiconductor structure 202, planarized first dielectric film 232 and second dielectric film 238. In some embodiments of the invention, the rms surface roughness of surface 240 of second dielectric film 238 may be further improved (i.e., reduced) by any of a number of methods known in the art. In some embodiments of the invention, the rms surface roughness of surface 240 may be improved by plasma processing. For example, a plasma smoothing process may comprise placing semiconductor structure 255 in a plasma reactor, and forming energetic plasma 242 within the reactor capable of reducing the rms surface roughness of surface 240 of second dielectric film 238. By way of a non-limiting example, plasma smoothing may be performed by exposing semiconductor structure 255 to an oxygen plasma. Additional information regarding generation of such an oxygen plasma may be found in, for example, Pasquariello et al., "Surface energy as a function of self-bias voltage in oxygen plasma wafer bonding," Sensors and Actuators 82 (2000) 239-244.

In additional embodiments of the invention, a plasma processing stage may be utilized to alter the surface chemistry of surface 240 of second dielectric film 238. Such a plasma process may be referred to as a "plasma activation" process. Such an alteration of the surface chemistry of surface 240 by plasma activation may be utilized to render surface 240 more suitable for attachment to additional semiconductor structures, for example, by rendering surface 240 substantially hydrophilic or substantially hydrophobic. For example, a plasma alteration of the surface chemistry of surface 240 may comprise placing semiconductor structure 255 in a plasma reactor and forming energetic plasma 242 within the reactor capable of altering the surface chemistry of surface 240 of second dielectric film 238. By way of a non-limiting example, plasma alteration of surface 240 may be performed by exposing semiconductor structure 255 to an oxygen plasma. Additional information regarding such a process may be found in, for example, Choi et al., "The analysis of Oxygen Plasma Pretreatment for Improving Anodic Bonding," Journal of the Electrochemical Society, 149 1 G8-G11 (2002).

It should be noted that either and/or both plasma smoothing and plasma surface chemistry alteration may be performed on surface 240 of second dielectric layer 232. The plasma smoothing and plasma surface chemistry alteration may be performed simultaneously during a single plasma process, or they may be performed sequentially utilizing separate plasma processes involving different plasma properties (e.g., differing gas chemistry, bias, flow rates, etc.) and/or equipment.

Upon plasma smoothing of the second dielectric film 238, the resulting smooth planar surface 240 may have a root mean square (rms) surface roughness of $R_4$. In addition, upon plasma surface chemistry alteration of surface 240 of second dielectric film 238, surface 240 may be substantially hydrophilic. In some embodiments of the invention, the surface roughness $R_4$ and the surface chemistry of surface 240 of second dielectric layer 238 may be sufficient to successfully attach another semiconductor structure to surface 240. In some embodiments of the invention, the surface roughness of surface 240 of second dielectric film 238 may be less than about 100 Å, less than about 10 Å, or even less than about 3 Å.

Figure 2F:
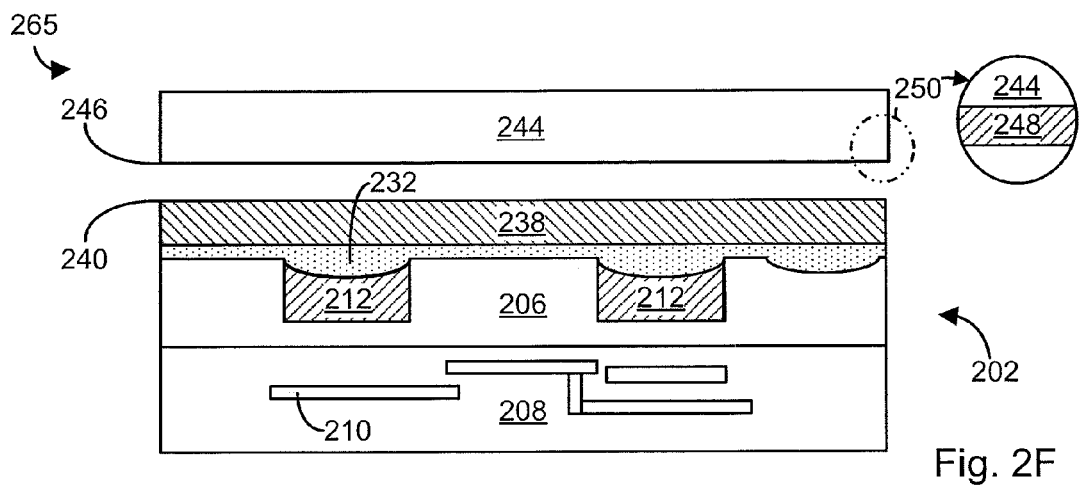

FIG. 2F illustrates semiconductor structure 265, which comprises processed semiconductor structure 202, first dielectric film 232, second dielectric film 238 and semiconductor structure 244 (which is not yet attached to the second dielectric film 238 in FIG. 2F). Second dielectric film 238 may include bonding surface 240, and semiconductor structure 244 may include bonding surface 246. In some embodiments of the invention, as shown in inset 250, semiconductor structure 244 may include a third dielectric film comprising a bond assisting layer 248. Bond assisting layer 248 may comprise one or more layers, and may comprise a number of different materials. In some embodiments of the invention, the bond assisting layer 248 may comprise one or more dielectric materials such as, for example, silicon oxide, silicon nitride and mixtures thereof (e.g., silicon oxynitride).

Semiconductor structure 244 may comprise a multitude of structures and materials. For example, semiconductor structure 244 may comprise at least one of a device structure and bonded structure (a structure that includes two or more layers, devices, or layers and devices bonded to one another).

As a non-limiting example, semiconductor structure 244 may comprise a semiconductor wafer, and processed semiconductor structure 202 may comprise a semiconductor wafer, such that subsequent bonding of the semiconductor structure 244 and the processed semiconductor structure 202 may be referred to as wafer-to-wafer bonding (W2W). In other embodiments of the invention, semiconductor structure 244 may comprise a semiconductor wafer and processed semiconductor structure 202 may comprise a semiconductor die, diced from a semiconductor wafer, such that subsequent bonding of the semiconductor structure 244 and the processed semiconductor structure 202 may be referred to as die-to-wafer bonding (D2W). In yet other embodiments of the invention, semiconductor structure 244 may comprise a semiconductor die, and processed semiconductor structure 202 may comprise a semiconductor die such that subsequent bonding of the semiconductor structure 244 and the processed semiconductor structure 202 may be referred to as die-to-die bonding (D2D).

In more detail, semiconductor structure 244 may comprise an at least substantially homogenous layer of a single material. Some such semiconductor structures include what are referred to in the art as free-standing substrates (FS-substrates). The homogeneous material may comprise, for example, elemental or compound materials, and may be conducting (e.g., metallic), semiconducting, or insulating. In some embodiments, the homogenous material may comprise one or more of silicon, germanium, silicon carbide, III-arsenides, III-phosphides, III-nitrides, III-antimonides, II-VI compounds, metals, metallic alloys, sapphire, quartz and zinc oxide. Furthermore, in some embodiments, the homogenous material may comprise a single crystal of material.

In additional embodiments of the invention, the semiconductor structure 244 may comprise a semiconductor structure including a heterogeneous structure comprising two or more different materials. Such a heterogeneous structure may include a template structure (such as, for example, a semiconductor layer) upon a base substrate. In such embodiments, the template structure and base substrate may comprise materials as mentioned previously. Further, the semiconductor structure may include two or more materials grown, deposited or placed on top of one another to form a layer stack. Again, such a structure may include materials previously described above.

In further embodiments of the invention, the semiconductor structure 244 may comprise a device structure. A device structure may comprise active components, passive components and/or mixtures thereof. The device structure may comprise, for example, one or more of switching structures (e.g., transistors, etc.), light emitting structures (e.g., laser diodes, light emitting diodes, etc.), light receiving structures (e.g., waveguides, splitters, mixers, photodiodes, solar cells, solar subcells, etc.), and microelectromechanical system structures (e.g., accelerometers, pressure sensors, etc.). In some embodiments of the invention, semiconductor structure 244 may comprise a processed semiconductor structure that has been processed utilizing methods of the invention, such that semiconductor structure 244 may comprise another semiconductor structure at least substantially similar (e.g., identical) to the semiconductor structure 255 of FIG. 2E.

In yet further embodiments of the invention, the semiconductor structure 244 may comprise a bonded structure in which two or more elements are attached and bonded together. In some embodiments of the invention, the bonded structure may be fabricated utilizing methods of the invention.

Figure 2G:
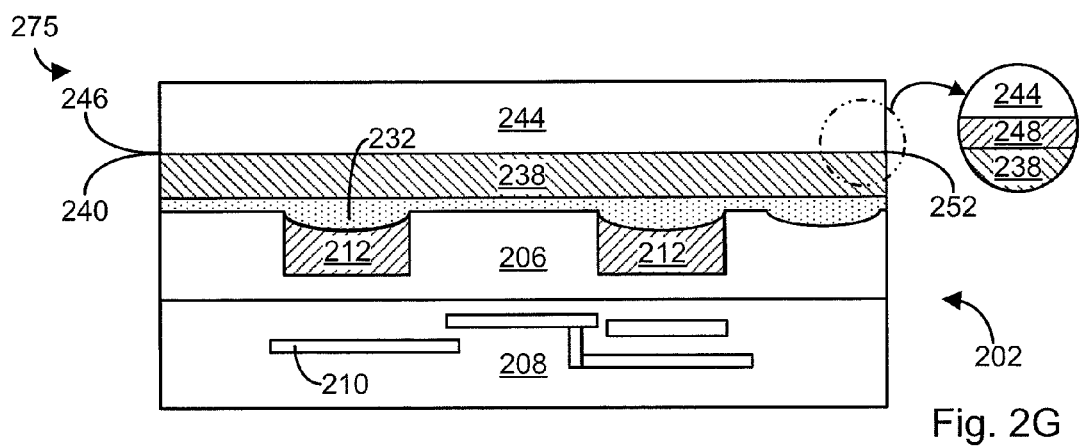

FIG. 2G illustrates semiconductor structure 275, which comprises processed semiconductor structure 202, planarized first dielectric film 232, second dielectric film 238 and semiconductor structure 244 bonded directly to the second dielectric film 238. Semiconductor structure 255 (FIG. 2E), which comprises processed semiconductor structure 202, first dielectric layer 232 and second dielectric layer 238, is attached to semiconductor structure 244 at a bonding interface 252. The bonding of processed semiconductor structure 202 to semiconductor structure 244 produces bonding interface 252, wherein bonding interface 252 is the interface between bonding surface 240 of second dielectric film 238 and bonding surface 246 of semiconductor structure 244.

The bonding of semiconductor structure 244 and processed semiconductor structure 202 through first dielectric film 232 and second dielectric film 238 can be produced by molecular adhesion (i.e., bonding without the use of a glue, wax, solder, etc.). For example, bonding operations may require that bonding surface 246 and bonding surface 240 be sufficiently smooth and free of particles and contamination, and that the surfaces 240 and 246 be sufficiently close to one another to allow contact therebetween to be initiated (commonly at a distance of less than 5 nm). When brought into such proximity, the forces of attraction between bonding surface 240 and surface 246 can be sufficiently high to cause molecular adhesion (bonding induced by all of the forces of attraction (e.g., Van Der Waals forces) resulting from the electronic interactions between the atoms or the molecules of the two surfaces 240 and 246).

The initiation of the molecular adhesion can commonly be achieved by application of localized pressure, for example, using a TEFLON® stylus on an element in close contact with another element in order to trigger propagation of a bonding wave from the point of initiation. The term "bonding wave" refers to the front of the bonds or the molecular adhesion spreading from the point of initiation and corresponding to the dissemination of the forces of attraction from the point of initiation over the entire interface between the bonding surface of second dielectric film 240 and the bonding surface of semiconductor structure 246 to form the bonding interface 252. For example, see the journal publications of Tong et al., Materials, Chemistry and Physics 37 101 1994, entitled "Semiconductor wafer bonding: recent developments," and Christiansen et al., Proceedings of the IEEE 94 12 2060 2006, entitled "Wafer Direct Bonding: From Advanced Substrate Engineering to Future Applications in Micro/Nanoelectronics."

Upon bonding of processed semiconductor structure 202 to semiconductor structure 244 via first dielectric film 232 and second dielectric film 238, further post bonding treatments may be performed. For example, semiconductor structure 275 may be annealed at a temperature of between 100° C. -600° C. to increase the bond strength between processed semiconductor structure 202 and semiconductor structure 244. Increasing the bond strength of semiconductor structure 275 may be performed to reduce the probability of unwanted separation of the processed semiconductor structure 202 and the semiconductor structure 244, such as might occur during possible further processing.

In certain embodiments, the second dielectric layer 238 may be deposited without concern for the underlying surface topology, since the first dielectric layer 232 may have an at least substantially planar surface. Therefore, the second dielectric film 238 may be formed in such a manner as to enable a high bonding energy between processed semiconductor structure 202 and semiconductor structure 244. Therefore, the bonding interface 252 may only require a low temperature anneal, or, alternatively, no additional thermal processes to produce significant bond strength, thereby improving the thermal budget of the overall attachment process.

Further processing of semiconductor structure 275 may comprise a multitude of further operations and procedures. For example, in some embodiments of the invention, semiconductor structure 244 of semiconductor structure 275 may be thinned utilizing methods known in the art. Such methods may comprise, for example, a grinding process, a polishing process, and/or an ion implantation and separation process. In additional embodiments of the invention, semiconductor structure 275 may be attached to one or more additional semiconductor structures. In additional embodiments of the invention, semiconductor structure 244 may be processed such that a plurality of devices are fabricated on and/or in a surface of semiconductor structure 244, thus forming an additional processed semiconductor structure. One or more of the methods for further processing of semiconductor structure 275 may be performed one or more times and may also utilize embodiments of methods of the invention for producing smooth planar surfaces for attachment of additional semiconductor layers to the semiconductor structure 275.

EXAMPLES

Non-limiting examples are now described to illustrate embodiments of the invention. It should be understood that, in the following examples, parameters, materials, structures, etc., are for illustrative purposes only, and do not limit embodiments of the present invention.

With reference to FIG. 2A, processed semiconductor structure 202 is provided, which comprises a complementary metal-oxide-semiconductor device substrate 208. The complementary metal-oxide-semiconductor device substrate 208 comprises a plurality of device structure 210 that include, amongst other features, field effect transistors. The plurality of conducting regions 212 comprise a barrier material, such as, for example, tantalum nitride and an electrode material comprising copper. Dielectric layer 206 may comprise silicon dioxide ($SiO_2$). The plurality of eroded regions 218 and the plurality of dished regions 216 are formed by CMP upon removal of a portion of conducting copper region 204 (shown in phantom).

With reference to FIG. 2B, first dielectric film 232 is deposited conformally over non-planar surface 220. First dielectric film comprises silicon dioxide ($SiO_2$) deposited by plasma enhanced chemical vapor deposition (PECVD) at a temperature of between 150° C. -400° C. The precursors for the PECVD deposition may include silane ($SiH_4$), tetraethyl orthosilicate (TEOS), oxygen ($O_2$), hydrogen ($H_2$) and nitrous oxide ($N_2O$). The average thickness of the first dielectric film $D_1$ is greater than the maximum peak to valley distance $PV_{max}$ of the non-planar surface 220. $D_1$ is greater than about 100 nm, although $D_1$ may be greater than about 1 μm in additional embodiments of the invention.

With reference to FIG. 2C, first dielectric film 232 is subjected to CMP to planarize the major surface of the first dielectric film 232 on the side thereof opposite the processed semiconductor structure 202 and provide the planar surface 236.

With reference to FIG. 2D, second dielectric film 238 is deposited conformally over planar surface 236 of first dielectric layer 232. Second dielectric layer 238 comprises silicon dioxide ($SiO_2$) deposited by plasma enhanced chemical vapor deposition (PECVD) at a temperature of between 150° C. -400° C. The precursors for the PECVD deposition of second dielectric layer 238 may include silane ($SiH_4$), tetraethyl orthosilicate (TEOS), oxygen ($O_2$), hydrogen ($H_2$) and nitrous oxide ($N_2O$).

With reference to FIG. 2E, second dielectric film 238 is subjected to a plasma activation and smoothing process in order to obtain a hydrophilic surface with an rms surface roughness suitable for attachment to a semiconductor structure. The plasma smoothing process is performed by placing semiconductor structure within a reactive ion etching (RIE) chamber and subjecting surface 240 to an oxygen plasma. The RIE chamber may be set to a pressure of approximately 0.050 Torr, whilst oxygen gas may be utilized as a source of oxygen ions, with a flow rate into the RIE chamber of approximately 30 standard cubic centimeters per minute (sccm). The plasma self-bias may be varied between −60 V and −360 V.

With reference to FIG. 2F, the semiconductor structure 244 comprises a silicon substrate, and bond assisting layer 248 comprises silicon dioxide ($SiO_2$).

With reference to FIG. 2G, the silicon substrate 244 with $SiO_2$ bond assisting layer 248 is brought into intimate contact with semiconductor structure 255, which comprises processed semiconductor structure 202, first dielectric film 232 and second dielectric film 238. Bonding interface 252 is produced between $SiO_2$ bonding assisting layer 248 and the bonding surface 240 of second dielectric film 238.

Additional non-limiting example embodiments of the invention are described below.

Embodiment 1

A method for forming a semiconductor structure comprising: forming a first dielectric film overlying a non-planar surface of a processed semiconductor structure, planarizing a surface of the first dielectric film, forming a second dielectric film overlying the planarized surface of the first dielectric film, and attaching a semiconductor structure to the second dielectric film.

Embodiment 2

The method of Embodiment 1, further comprising depositing at least one of the first dielectric film and the second dielectric film using a plasma assisted chemical vapor deposition process.

Embodiment 3

The method of Embodiment 1 or Embodiment 2, further comprising depositing at least one of the first dielectric film and the second dielectric film at a temperature less than about 400° C.

Embodiment 4

The method of any one of Embodiments 1 through 3, wherein planarizing a surface of the first dielectric film further comprises chemical-mechanical polishing a non-planar surface of the first dielectric film.

Embodiment 5

The method of any one of Embodiments 1 through 4, wherein forming the first dielectric film overlying the non-planar surface comprises plugging a plurality of dished regions of the processed semiconductor structure and plugging a plurality of eroded regions of the processed semiconductor structure.

Embodiment 6

The method of any one of Embodiments 1 through 5, wherein forming a second dielectric film overlying the planarized surface of the first dielectric film comprises smoothing and activating the second dielectric film using a plasma process.

Embodiment 7

The method of any one of Embodiments 1 through 6, further comprising forming the non-planar surface of the processed semiconductor structure to comprise a plurality of dished regions and a plurality of eroded regions.

Embodiment 8

The method of Embodiment 7, wherein forming the non-planar surface of the processed semiconductor structure to comprise a plurality of dished regions and a plurality of eroded regions comprises removing at least a portion of a metal layer on the processed semiconductor structure.

Embodiment 9

A method for forming a semiconductor structure comprising: forming at least one dished region and at least one eroded region in a surface of a processed semiconductor structure; plugging the at least one dished region and the at least one eroded region by depositing a first dielectric film over the surface of the processed semiconductor structure, planarizing the first dielectric film by polishing the first dielectric film, depositing a second dielectric film over the first dielectric film, and bonding a surface of a semiconductor structure to a surface of the second dielectric film.

Embodiment 10

The method of Embodiment 9, wherein depositing the first dielectric film further comprises forming the first dielectric film to have an average film thickness greater than a maximum peak to valley distance of the surface of the processed semiconductor structure.

Embodiment 11

The method of Embodiment 9 or Embodiment 10, further comprising selecting the processed semiconductor structure to comprise a CMOS integrated circuit.

Embodiment 12

The method of any one of Embodiments 9 through 11, wherein planarizing the first dielectric film further comprises chemical-mechanical polishing the first dielectric film.

Embodiment 13

The method of any one of Embodiments 9 through 12, wherein forming the at least one dished region and the at least one eroded region in the surface of the processed semiconductor structure comprises removing a portion of a conducting layer on the processed semiconductor structure to form the at least one dished region and the at least one eroded region.

Embodiment 14

A semiconductor structure comprising: a processed semiconductor structure comprising a non-planar surface, a first dielectric film overlying the non-planar surface, a second dielectric film overlying the first dielectric film, and a semiconductor structure attached to the second dielectric film.

Embodiment 15

The semiconductor structure of Embodiment 14, wherein the processed semiconductor structure comprises: a device substrate, a conducting region, and a dielectric layer.

Embodiment 16

The semiconductor structure of Embodiment 15, wherein the device substrate comprises at least one semiconductor device comprising at least one of an electronic device, an optoelectronic device, a photovoltaic device, and a microelectromechanical device.

Embodiment 17

The semiconductor structure of any one of Embodiments 14 through 16, wherein the non-planar surface comprises: a plurality of dished regions, and a plurality of eroded regions.

Embodiment 18

The semiconductor structure of Embodiment 17, wherein the first dielectric film plugs the plurality of dished regions and the plurality of eroded regions.

Embodiment 19

The semiconductor structure of any one of Embodiments 14 through 18, wherein the first dielectric film and the second dielectric film comprise at least one of silicon oxide, silicon nitride, and a mixture of silicon oxide and silicon nitride.

Embodiment 20

The semiconductor structure of any one of Embodiments 14 through 20, wherein the first dielectric film has an average thickness greater than a maximum peak to valley distance of the non-planar surface.

Embodiment 21

The semiconductor structure of any one of Embodiments 14 through 21, wherein the semiconductor structure comprises a third dielectric film.

Embodiment 22

The semiconductor structure of Embodiment 21, wherein the second dielectric film is directly bonded to the third dielectric film at a bonding interface.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims. Headings and legends are used herein for clarity and convenience only.

What is claimed is:

1. A method for forming a semiconductor structure comprising:
    removing at least a portion of a metal layer on a processed semiconductor structure and forming a non-planar surface of the processed semiconductor structure comprising a plurality of dished regions and a plurality of eroded regions;
    forming a first dielectric film overlying the non-planar surface of a processed semiconductor structure;
    planarizing a surface of the first dielectric film;
    forming a second dielectric film overlying the planarized surface of the first dielectric film; and
    attaching a semiconductor structure to the second dielectric film.

2. The method of claim 1, further comprising depositing at least one of the first dielectric film and the second dielectric film using a plasma assisted chemical vapor deposition process.

3. The method of claim 1, further comprising depositing at least one of the first dielectric film and the second dielectric film at a temperature less than about 400° C.

4. The method of claim 1, wherein planarizing a surface of the first dielectric film further comprises chemical-mechanical polishing a non-planar surface of the first dielectric film.

5. The method of claim 1, wherein forming the first dielectric film overlying the non-planar surface comprises plugging a plurality of dished regions of the processed semiconductor structure and plugging a plurality of eroded regions of the processed semiconductor structure.

6. The method of claim 1, wherein forming a second dielectric film overlying the planarized surface of the first dielectric film comprises smoothing and activating the second dielectric film using a plasma process.

7. The method of claim 1, further comprising:
    plugging the plurality of dished regions and the plurality of eroded regions by depositing the first dielectric film over the non-planar surface of the processed semiconductor structure;
    polishing the first dielectric film to planarize the surface of the first dielectric film;
    depositing the second dielectric film over the first dielectric film to form the second dielectric film overlying the planarized surface of the first dielectric film; and
    bonding a surface of the semiconductor structure to a surface of the second dielectric film to attach the semiconductor structure to the second dielectric film.

8. The method of claim 7, wherein depositing the first dielectric film further comprises forming the first dielectric film to have an average film thickness greater than a maximum peak to valley distance of the surface of the processed semiconductor structure.

9. The method of claim 7, further comprising selecting the processed semiconductor structure to comprise a complementary metal-oxide semiconductor (CMOS) integrated circuit.

10. The method of claim 7, wherein polishing the first dielectric film further comprises chemical-mechanical polishing the first dielectric film.

11. The method of claim 7, wherein forming the plurality of dished regions and the plurality of eroded regions in the surface of the processed semiconductor structure comprises removing a portion of a conducting layer on the processed semiconductor structure to form the plurality of dished regions and the plurality of eroded regions.

12. A semiconductor structure comprising:
    a plurality of dished regions and a plurality of eroded regions in a metal layer at a non-planar surface of a processed semiconductor structure;
    a first dielectric film overlying the non-planar surface;
    a second dielectric film overlying the first dielectric film; and
    a semiconductor structure attached to the second dielectric film.

13. The semiconductor structure of claim 12, wherein the processed semiconductor structure comprises:
    a device substrate;
    a conducting region; and
    a dielectric layer.

14. The semiconductor structure of claim 13, wherein the device substrate comprises at least one semiconductor device comprising at least one of an electronic device, an optoelectronic device, a photovoltaic device, and a microelectromechanical device.

15. The semiconductor structure of claim 12, wherein the first dielectric film plugs the plurality of dished regions and the plurality of eroded regions.

16. The semiconductor structure of claim 12, wherein the first dielectric film and the second dielectric film comprise at least one of silicon oxide, silicon nitride, and a mixture of silicon oxide and silicon nitride.

17. The semiconductor structure of claim 12, wherein the first dielectric film has an average thickness greater than a maximum peak to valley distance of the non-planar surface.

18. The semiconductor structure of claim 12, wherein the semiconductor structure comprises a third dielectric film.

19. The semiconductor structure of claim 18, wherein the second dielectric film is directly bonded to the third dielectric film at a bonding interface.

* * * * *